(12) United States Patent
He et al.

(10) Patent No.: US 12,622,327 B2
(45) Date of Patent: May 5, 2026

(54) MICRO LIGHT-EMITTING DIODE

(71) Applicant: RAYLEIGH VISION LIMITED, Kowloon (HK)

(72) Inventors: Jr-Hau He, Kowloon (HK); Chun-Wei Tsai, New Taipei City (TW); Zhi-Ting Ye, Miaoli County (TW); Der-Hsien Lien, Taipei (TW); Yuk-Tong Cheng, Kowloon (HK)

(73) Assignee: RAYLEIGH VISION INTELLIGENCE CO. LTD., Hsinchu City (TW)

( * ) Notice: Subject to any disclaimer, the term of this patent is extended or adjusted under 35 U.S.C. 154(b) by 518 days.

(21) Appl. No.: 18/211,738

(22) Filed: Jun. 20, 2023

(65) Prior Publication Data

US 2024/0429212 A1 Dec. 26, 2024

(51) Int. Cl.
*H01L 25/075* (2006.01)
*H10H 20/857* (2025.01)

(52) U.S. Cl.
CPC ....... *H01L 25/0756* (2013.01); *H10H 20/857* (2025.01); *H01L 25/0753* (2013.01)

(58) Field of Classification Search
None
See application file for complete search history.

(56) References Cited

U.S. PATENT DOCUMENTS

| | | | | |
|---|---|---|---|---|
| 2006/0055309 A1* | 3/2006 | Ono | ..................... | H01L 25/0753 |
| | | | | 257/E33.059 |
| 2010/0044743 A1* | 2/2010 | Liu | ......................... | H10H 20/84 |
| | | | | 257/E33.056 |
| 2017/0345802 A1* | 11/2017 | Sung | ................... | H10H 20/8515 |
| 2019/0115498 A1* | 4/2019 | Wu | ........................ | H10H 20/819 |

FOREIGN PATENT DOCUMENTS

| | | | | | |
|---|---|---|---|---|---|
| CN | 107068811 A | * | 8/2017 | ......... | H01L 25/0753 |
| CN | 113568079 B | * | 10/2023 | ......... | H10H 20/8516 |
| EP | 3410479 A1 | * | 12/2018 | ......... | H01L 25/0753 |
| KR | 20200021858 A | * | 3/2020 | ............. | H01L 33/36 |

* cited by examiner

*Primary Examiner* — Michael Lebentritt
(74) *Attorney, Agent, or Firm* — WPAT, PC

(57) ABSTRACT

The present invention provides a micro light-emitting diode (LED). A conductive layer is disposed on a substrate. A light-emitting assembly is disposed on the conductive layer. A first light-emitting semiconductor and a second light-emitting semiconductor of the light-emitting assembly are stacked vertically. A first conductive bump and a second conductive bump of a conductive bump set electrical conduct the first light-emitting semiconductor and the second light-emitting semiconductor. Thereby, the volume of the micro LED can be shrunk.

10 Claims, 6 Drawing Sheets

MICRO LIGHT-EMITTING DIODE

FIELD OF THE INVENTION

The present application related to a structure, in particular to a micro light-emitting diode (LED).

BACKGROUND OF THE INVENTION

Owing to the continuous progress of technologies in recent years and the development in display technologies, the applications of light-emitting diodes (LEDs) become more extensive increasingly.

LED lamps are the lamps adopting LEDs as the light sources and are generally made by semiconductor LEDs. A semiconductor is a semiconductor light source. When a current flows through a semiconductor LED, it emits light. Being a light-emitting semiconductor device enabled by electricity, when electrons and holes recombine therein, the energy will be released in the form of photons. The core part of an LED structure is the p-n junction with surrounding epoxy sealing the leads and frame for protecting the internal chips. When a forward current flows through the p-n junction, the visible or invisible radiation will be emitted. This radiation is a compound light source formed by trivalent and pentavalent elements.

The lifetime and the light-emitting efficiency of an LED lamp are a multiple of those of an incandescent lamp and much higher than those of an integrated fluorescent lamp. The illuminance of a single LED is much lower a traditional incandescent lamp and an energy-saving light bulb. Thereby, a lamp normally will include multiple LEDs.

In recent years, LED technologies have improved. High-power and high-luminance LEDs are developed successively, making them in the trend of replacing traditional light sources gradually. There have been vendors providing high-power LED chips for a single lamp. It requires only 100 watts of electrical power to convert to 7,527 lumens of luminous flux. In addition to the lamps designed specifically for LEDs, after adding conversion circuits and related stabilization devices, LEDs can be integrated with other light sources and installed in the lamps for traditional light sources.

Unfortunately, according to the current LED technology, to use LEDs as the light sources in the light-emitting modules, the LEDs and the driving devices for LED should be connected electrically for lighting the LEDs.

Since the wires of the LEDs and those of the driving devices in the light-emitting modules are not located on the same layer, it is required to drill holes in the substrate before the wires of the LEDs and the driving devices can be connected electrically.

According to the prior art, to emit a certain amount of luminance, the light-emitting module must include a certain number of LEDs, which results in a vast number of wires and a large volume of optoelectronic diodes. In addition, the circuit layout inside the light-emitting modules will become quite complicated and the volume of the light-emitting modules will become large as well.

Accordingly, how to fabricate micro optoelectronic diodes with decreased number of wires and overall size have become the major challenges in the field.

SUMMARY OF THE INVENTION

An objective of the present invention is to provide a micro LED, which shrinks the overall volume by vertically stacking a first light-emitting semiconductor and a second light-emitting semiconductor. Thanks to the vertically stacked structure, the number of wires is halved and thus achieving the purpose of reducing the wires.

To achieve the above objective, the present invention provides a micro LED, which comprises a substrate, a conductive layer, a light-emitting assembly, and a conductive bump set. The conductive layer includes a first electrode and a second electrode disposed on the substrate apart. The light-emitting assembly is disposed on the conductive layer and includes a first light-emitting semiconductor and a second light-emitting semiconductor. The second light-emitting semiconductor is disposed vertically on the first light-emitting semiconductor. A first light-emitting element of the first light-emitting semiconductor includes a first light-emitting layer. The first light-emitting layer includes a first area. A second light-emitting element of the second light-emitting semiconductor includes a second light-emitting layer. The second light-emitting layer includes a second area. The second area is greater than the first area. The conductive bump set includes a first conductive bump and a second conductive bump. An end of the first conductive bump is disposed on the first electrodes and extending to a side of a first n-type electrode and a side of a second p-type electrode. An end of the second conductive bump is disposed on the second electrodes and extending to a side of a first p-type electrode and a side of a second n-type electrode. during a persistence of vision, any of said first electrode and said second electrode receives a control signal from said conductive layer for electrical conduction in one of said first light-emitting semiconductor and said second light-emitting semiconductor.

According to an embodiment of the present invention, the control signal includes a first electrical signal and a second electrical signal. The first electrical signal and the second electrical signal are used to electrical conduct the first light-emitting semiconductor and the second light-emitting semiconductor sequentially. The first electrical signal is transmitted from the first electrical electrode to the first light-emitting semiconductor and enters the second electrode. The second electrical signal is transmitted from the second electrical electrode to the second light-emitting semiconductor and enters the first electrode.

According to an embodiment of the present invention, the wavelengths of the light emitted from the first light-emitting element and the second light-emitting element are between 300 nm and 800 nm.

According to an embodiment of the present invention, the wavelengths of the light emitted from the first light-emitting element and the second light-emitting element are different.

According to an embodiment of the present invention, an end of the first conductive bump is connected electrically to the contacts of the first n-type semiconductor and the second p-type semiconductor. Another end of the first conductive bump is connected electrically to the first electrode.

According to an embodiment of the present invention, an end of the second conductive bump is connected electrically to the contacts of the first p-type semiconductor and the second n-type semiconductor. Another end of the second conductive bump is connected electrically to the second electrode.

According to an embodiment of the present invention, the conductive layer further includes a third electrode and a fourth electrode. The third electrode is disposed on a side of the second electrode. The fourth electrode is disposed on another side of the third electrode apart.

According to an embodiment of the present invention, the micro LED further comprises a third light-emitting semiconductor, which includes a third light-emitting element, a third n-type electrode, and a third p-type electrode. A side of the third light-emitting element is disposed on an end of the third n-type electrode and an end of the third p-type electrode. Another end of the third n-type electrode is disposed on the fourth electrode. Another end of the third p-type electrode is disposed on the third electrode. The third electrode transmits a third electrical signal of the control signal to the fourth electrode through the third light-emitting semiconductor for turning on the third light-emitting semiconductor continuously.

According to an embodiment of the present invention, the wavelength of the light emitted from the third light-emitting element is between 300 nm and 800 nm; and the wavelength of the light emitted from the third light-emitting element is different from the wavelengths of the light emitted from the first light-emitting element and the second light-emitting element.

According to an embodiment of the present invention, the first light-emitting element, the second light-emitting element, and the third light-emitting element include an n-type semiconductor and a p-type semiconductor, respectively. The n-type semiconductors are disposed below the first light-emitting layer, the second light-emitting layer, and the third light-emitting layer, respectively. The p-type semiconductors are disposed on the first light-emitting layer, the second light-emitting layer, and the third light-emitting layer, respectively. The n-type semiconductors are disposed on an insulating substrate.

DETAILED DESCRIPTION OF THE INVENTION

Since the wires of the LEDs and those of the driving devices in the light-emitting modules of the LEDs according to the prior art are not located on the same layer, it is required to drill holes in the substrate before the wires of the LEDs and the driving devices can be connected electrically. To emit a certain amount of luminance, the light-emitting module must include a certain number of LEDs, which results in a vast number of wires and a large volume of optoelectronic diodes. In addition, the circuit layout inside the light-emitting modules will become quite complicated and the volume of the light-emitting modules will become large as well.

The present invention discloses a micro LED formed by vertically stacking the first light-emitting semiconductor and the second light-emitting semiconductor. Thanks to the vertically stacked structure, the number of wires is halved and thus achieving the purpose of reducing the wires. Besides, the overall volume can be shrunk accordingly.

In the following description, various embodiments of the present invention are described using figures for describing the present invention in detail. Nonetheless, the concepts of the present invention can be embodied by various forms. Those embodiments are not used to limit the scope and range of the present invention.

Figure 1A:
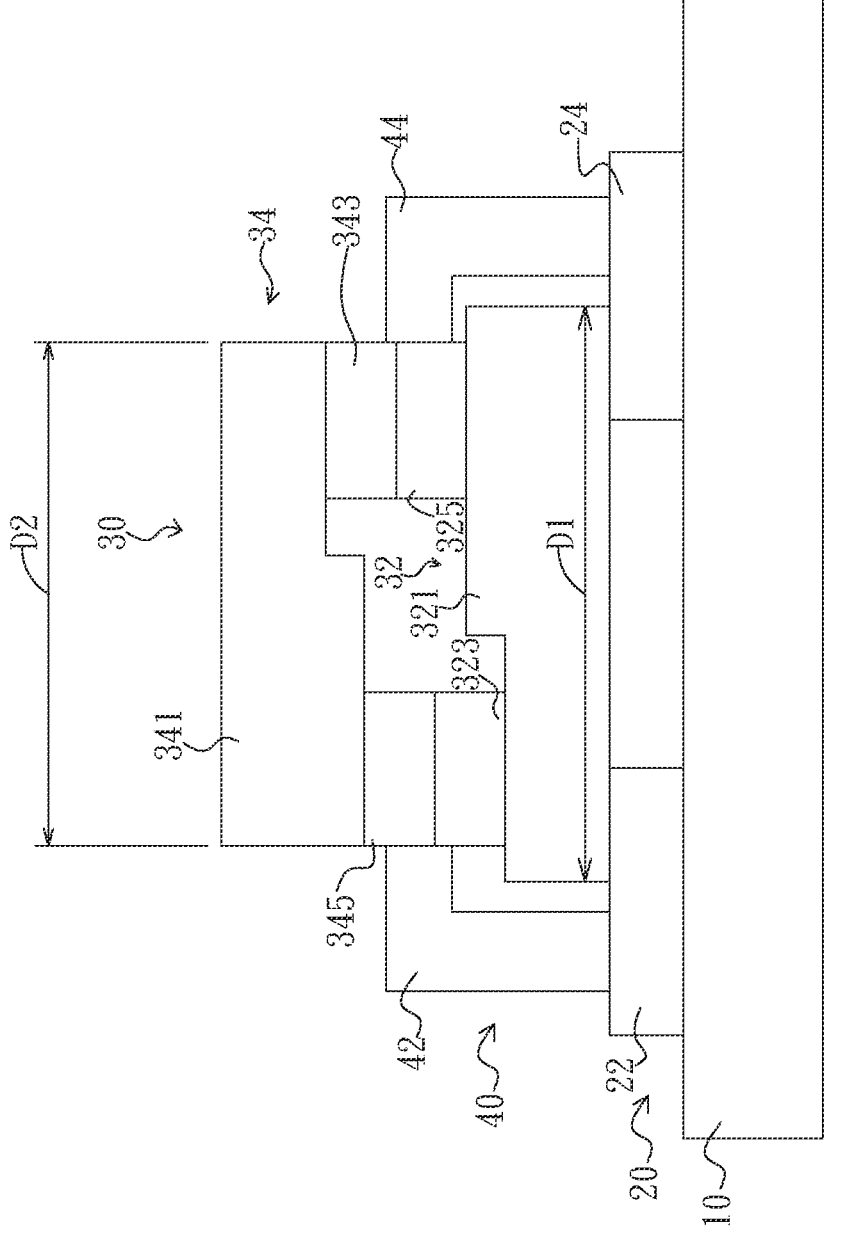
FIG. 1A shows a schematic diagram of the structure of the micro LED according to a first embodiment of the present invention.

First, please refer to FIG. 1A, which shows a schematic diagram of the structure of the micro LED according to a first embodiment of the present invention. As shown in the FIG., the micro LED according to the present embodiment comprises a substrate 10, a conductive layer 20, a light-emitting assembly 30, and a conductive bump set 40.

According to the present embodiment, the conductive layer 20 is disposed on the substrate 10 and includes a first electrode 22 and a second electrode 24 disposed on the substrate 10 apart. The material of the substrate 10 is selected from the group consisting of gallium nitride, gallium arsenide, gallium phosphide, indium phosphide, silicon carbide, and aluminum oxide.

According to the present embodiment, the light-emitting assembly 30 is disposed on the conductive layer 20 and includes a first light-emitting semiconductor 32 and a second light-emitting semiconductor 34.

According to the present embodiment, the first light-emitting semiconductor 32 includes a first light-emitting element 321, a first n-type electrode 323, and a first p-type electrode 325. A side of the first light-emitting element 321 is disposed on the conductive layer 20. The first n-type electrode 323 and the first p-type electrode 325 are disposed on another side of the first light-emitting element 321. The first light-emitting element 321 includes a first light-emitting layer 3215. The first light-emitting layer 3215 includes a first area D1.

Figure 2A:
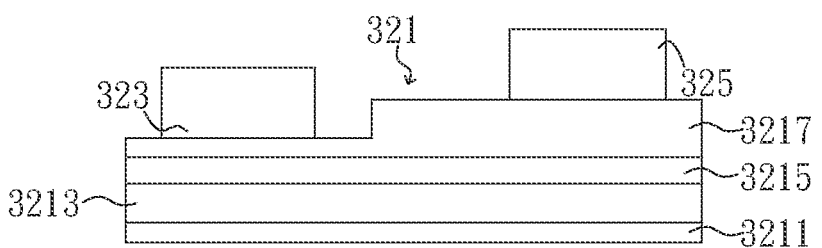
FIG. 2A shows a schematic diagram of the first light-emitting element of the micro LED according to a first embodiment of the present invention.

Please refer to FIG. 2A, which shows a schematic diagram of the first light-emitting element of the micro LED according to a first embodiment of the present invention. As shown in the figure, the first light-emitting element 321 includes an n-type semiconductor 3213 and a p-type semiconductor 321. The n-type semiconductor 3213 is disposed below the first light-emitting layer 3215; the p-type semiconductor 3217 is disposed on the first light-emitting layer 3215. The n-type semiconductor 3213 is disposed on an insulating substrate 3211. A side of the first light-emitting element 321 is disposed on the conductive layer 20. By using the insulating substrate 3211, the first light-emitting element 321 will not be connected electrically with the conductive layer 20.

Figure 2B:
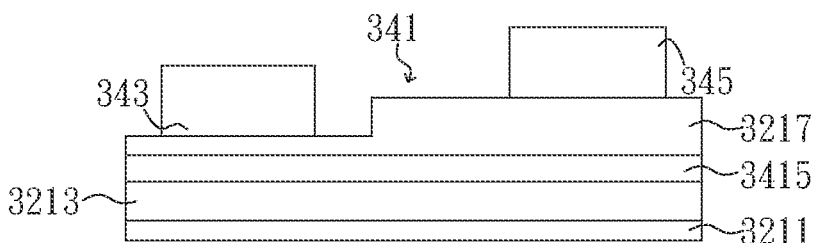
FIG. 2B shows a schematic diagram of the second light-emitting element of the micro LED according to a first embodiment of the present invention.

Next, please refer to FIG. 2B, which shows a schematic diagram of the second light-emitting element of the micro LED according to a first embodiment of the present invention. As shown in the figure, according to the present embodiment, the second light-emitting semiconductor 34 is disposed vertically on the first light-emitting semiconductor 32. The second light-emitting semiconductor 34 includes a second light-emitting element 341, a second n-type electrode 343, and a second p-type electrode 345. The second n-type electrode 343 is disposed on the first p-type electrode 325. The second p-type electrode 345 is disposed on the first n-type electrode 323. The second light-emitting element 341 is disposed on the second p-type electrode 345 and the second n-type electrode 343. The second light-emitting element 341 includes a second light-emitting layer 3415. The second light-emitting layer 3415 includes a second area D2. The first area D1 is greater than the second area D2. By making the first area D1 of the first light-emitting element 321 of the first light-emitting semiconductor 32 disposed blow greater than the second area D2 of the second light-emitting element 341, the light source can scatter normally.

According to the present embodiment, the structure of the second light-emitting element 341 incudes the n-type semiconductor 3213 and the p-type semiconductor 3217. The n-type semiconductor 3213 is disposed below the second light-emitting layer 3415; the p-type semiconductor 3217 is disposed on the second light-emitting layer 3415. The n-type semiconductor 3213 is disposed on the insulating substrate 3211.

According to the present embodiment, the wavelengths of the light emitted from the first light-emitting element 321 and the second light-emitting element 341 are between 300 nm and 800 nm. The wavelengths of the light emitted from the first light-emitting element 321 and the second light-emitting element 341 are different. In other words, when the wavelength of the first light-emitting element 321 is the red light (710 nm), the wavelength of the second light-emitting element 341 will be the blue light (470 nm) or the green light (550 nm), instead of being the red light as well. When the first light-emitting element 321 emits the blue (or the green) light, the situation is the same.

Next, according to the present embodiment, please refer to FIG. 1A again. The conductive bump set 40 includes a first conductive bump 42 and a second conductive bump 44. An end of the first conductive bump 42 is disposed on the first electrode 22 and extending to a side of the first n-type electrode 323 and to a side of the second p-type electrode 345. An end of the second conductive bump 44 is disposed on the second electrode 24 and extending to a side of the first p-type electrode 325 and to a side of the second n-type electrode 343.

According to the present embodiment, an end of the first conductive bump 42 is connected electrically to the first electrode 22 and the contacts of the first n-type semiconductor 323 and the second p-type semiconductor 345. An end of the second conductive bump 44 is connected electrically to the second electrode 24 and the contacts of the first p-type semiconductor 325 and the second n-type semiconductor 343. Thereby, the micro LED according to the present embodiment can drive the light-emitting assembly 30 to emit light via the conductive bump set 40.

Figures 1B, 1C:
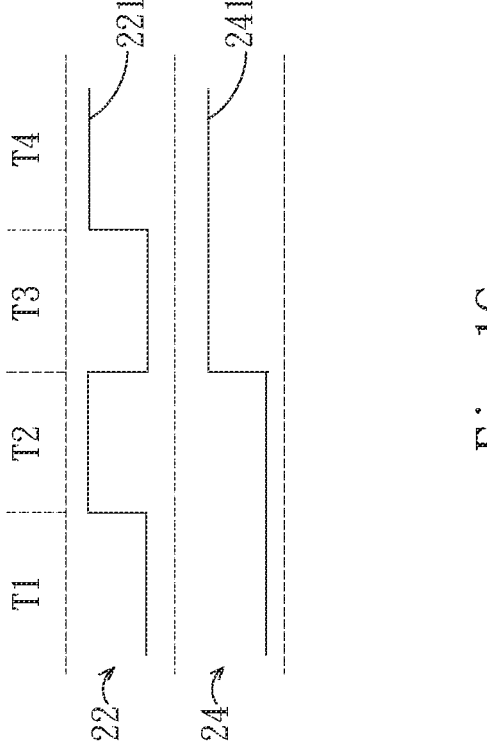
FIG. 1B shows a schematic diagram of the circuit of the micro LED according to a first embodiment of the present invention.
FIG. 1C shows a schematic diagram of the control signal of the micro LED according to a first embodiment of the present invention.

According to the present embodiment, please refer to FIG. 1B, which shows a schematic diagram of the circuit of the micro LED according to a first embodiment of the present invention. As shown in the figure, the positive electrode of the first light-emitting semiconductor 32 is connected to the negative electrode of the second light-emitting semiconductor 34. Meanwhile, the positive electrode of the second light-emitting semiconductor 34 is connected to the negative electrode of the first light-emitting semiconductor 32. Thereby, the first light-emitting semiconductor 32 and the second light-emitting semiconductor 34 form a loop. Then the micro LED according to the present embodiment can emit light after turning on.

Please refer again to FIG. 1A. In addition, please also refer to FIG. 1C, which shows a schematic diagram of the control signal of the micro LED according to a first embodiment of the present invention. As shown in the figures, according to the present embodiment, during a persistence of vision (not shown in the figures), any of the first electrode 22 and the second electrode 24 receives a control signal (not shown in the figures) from the conductive layer 20. The control signal is used to electrical conduct in one of the first light-emitting semiconductor 32 and the second light-emitting semiconductor 34.

According to the present embodiment, the control signal includes a first electrical signal 221 and a second electrical signal 241. The first electrical signal 221 and the second electrical signal 241 are used to electrical conduct the first light-emitting semiconductor 32 and the second light-emitting semiconductor 34 sequentially. Furthermore, the first electrical signal 221 and the second electrical signal 241 are turn-on signals alternately.

According to the present embodiment, within the persistence time of vision, the first electrical signal of the control signal is transmitted from the first electrical electrode 22 to the first light-emitting semiconductor 32 and enters the second electrode 24. The second electrical signal 241 of the control signal is transmitted from the second electrical electrode 24 to the second light-emitting semiconductor 34 and enters the first electrode 22. The persistence time of vision includes a first time T1, a second time T2, a third time T3, and a fourth time T4.

The control signal is a pulse-width modulation (PWM) signal. Furthermore, the persistence time of vision is the 0.01 to 0.1 second of lag and persistence of image while seeing objects or moving objects by human eyes. Preferably, the persistence time of vision is 0.1 second.

According to the present embodiment, when the first electrical signal 221 and the second electrical signal 241 apply a low voltage to the first light-emitting semiconductor 32 and the second light-emitting semiconductor 34 at the first time T1, since there is no voltage difference therebetween, the first light-emitting semiconductor 32 and the second light-emitting semiconductor 34 are shut off (no light emission).

When the first electrical signal 221 applies a high voltage to the first light-emitting semiconductor 32 at the second time T2 and the second electrical signal 241 applies a low voltage to the second light-emitting semiconductor 34 at the second time T2, the first light-emitting semiconductor 32 is turned on (emits light) and the second light-emitting semiconductor 34 is turned off (no light emission) due to the reverse current.

In addition, when the first electrical signal 221 applies a low voltage to the first light-emitting semiconductor 32 at the third time T3 and the second electrical signal 241 applies a high voltage to the second light-emitting semiconductor 34 at the third time T3, the first light-emitting semiconductor 32 is turned off (no light emission) due to the reverse current the second light-emitting semiconductor 34 is turned on (emits light).

When the first electrical signal 221 and the second electrical signal 241 apply a high voltage to the first light-emitting semiconductor 32 and the second light-emitting semiconductor 34 at the fourth time T4, since there is no voltage difference therebetween, the first light-emitting semiconductor 32 and the second light-emitting semiconductor 34 are shut off (no light emission).

According to the present embodiment, only one of the first light-emitting semiconductor 32 and the second light-emitting semiconductor 34 will be turned on at any moment; they will not be turned on concurrently. In other words, when the first light-emitting semiconductor 32 emits light, the second light-emitting semiconductor 34 will be shut off, and vice versa. By using this light-emitting method, the differences among flat RGB pixels can be conspicuous effectively.

Furthermore, according to the present embodiment, when the wavelength of the first light-emitting semiconductor 32 is the fluorescent wavelength (for example, 365 nm), the wavelength of the light emitted from the second light-emitting semiconductor 34 should be coordinated to exhibit white light as viewed by the user by considering the visual influence of persistence of vision on retinae.

In the past, LEDs are arranged in a matrix to form a lighting device. Nonetheless, since the wires of the LEDs and those of the driving devices in the structure are not located on the same layer, it is required to drill holes in the substrate before the wires of the LEDs and the driving devices can be connected electrically, resulting in a vast number of wires. Consequently, the circuit layout inside the light-emitting modules will become quite complicated and the volume of the light-emitting modules will become large as well.

The advantage of the present embodiment (the first embodiment) is improving micro LEDs. A novel micro LED is formed by vertically stacking the first light-emitting semiconductor 32 and the second light-emitting semiconductor 34. Thanks to the vertically stacked structure, the number of wires is halved and thus achieving the purpose of reducing the wires. Besides, the overall volume can be shrunk accordingly.

Figure 3A:
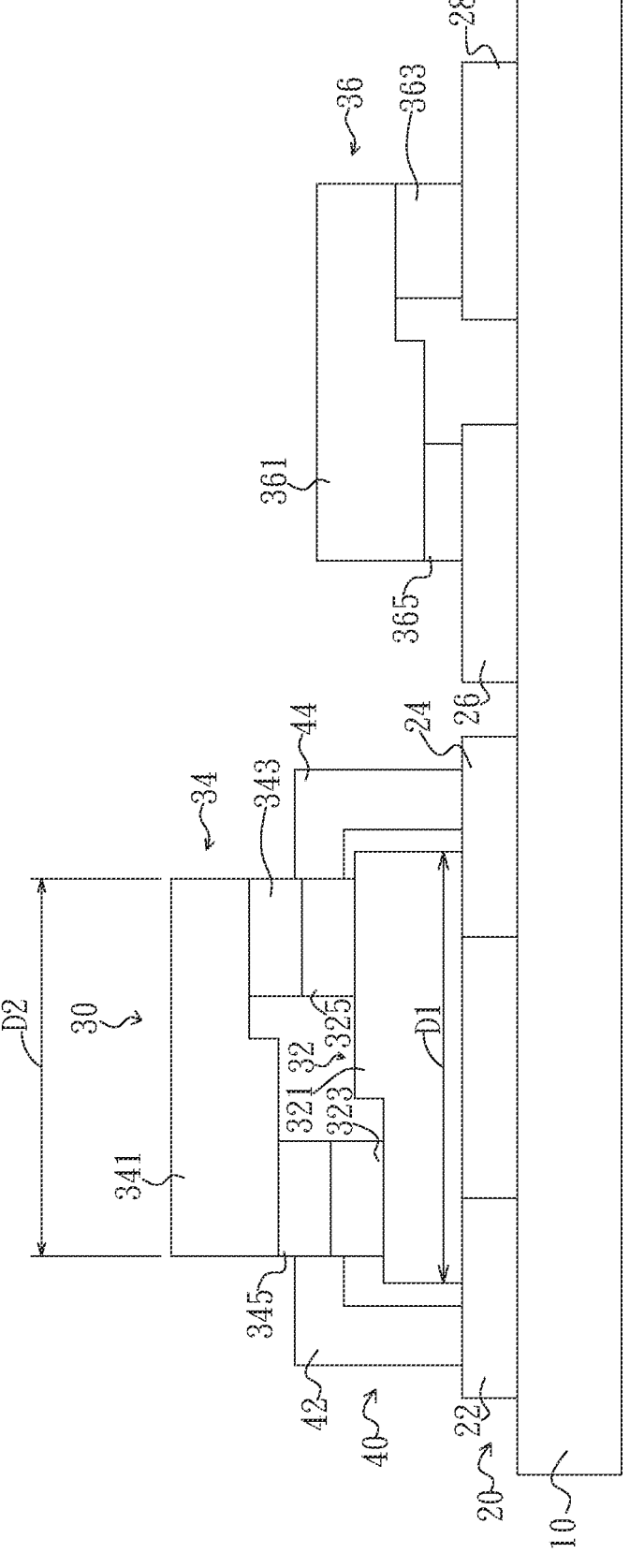
FIG. 3A shows a schematic diagram of the structure of the micro LED according to a second embodiment of the present invention.

Next, please refer to FIG. 3A, which shows a schematic diagram of the structure of the micro LED according to a second embodiment of the present invention. As shown in the figure, the connection of the substrate 10, the conductive layer 20, the light-emitting assembly 30, and the conductive bump set 40 is the same as the previous embodiment. Hence, the details will not be repeated.

Nonetheless, according to the present embodiment, the conductive layer 20 further includes a third electrode 26 and a fourth electrode 28. The third electrode 26 is disposed on a side of the second electrode 24. The fourth electrode 28 is disposed on another side of the third electrode 26 apart.

Figure 3B:
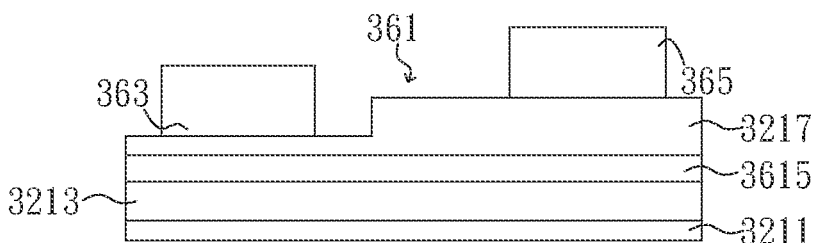
FIG. 3B shows a schematic diagram of the first light-emitting element of the micro LED according to a second embodiment of the present invention.

Besides, please refer again to FIGS. 3A and 3B. According to the present embodiment, the micro LED further comprises a third light-emitting semiconductor 36, which includes a third light-emitting element 361, a third n-type electrode 363, and a third p-type electrode 365. An end of the third n-type electrode 363 and an end of the third p-type electrode 365 are disposed on a side of the third light-emitting element 361. Another end of the third n-type electrode 363 is disposed on the fourth electrode 28. Another end of the third p-type electrode 365 is disposed on the third electrode 36.

According to the present embodiment, the structure of the third light-emitting element 361 includes the n-type semiconductor 3213 and the p-type semiconductor 3217. The n-type semiconductor 3213 is disposed below a third light-emitting layer 3615. The p-type semiconductor 3217 is disposed on the third light-emitting layer 3615. The n-type semiconductor 3213 is disposed on the insulating substrate 3211.

According to the present embodiment, the wavelength of the light emitted from the third light-emitting element 361 is between 300 nm and 800 nm. In addition, the wavelength of the light emitted from the third light-emitting element 361 is different from the wavelengths of the light emitted from the first light-emitting element 321 and the second light-emitting element 341. In other words, for example, when the wavelength of the first light-emitting element 321 is the red light (710 nm), the wavelength of the second light-emitting element 341 will be the blue light (470 nm) and the wavelength of the third light-emitting element 361 will be the green light (550 nm). There will be no configuration that any two or all three of the three light-emitting elements have the same wavelength.

From the first time T1 to the fourth time T4, the operations of the first light-emitting element 321 of the first light-emitting semiconductor 32 and the second light-emitting element 341 of the second light-emitting semiconductor 34 are the same as those according to the first embodiment. Hence, the details will not be repeated here.

The third electrode 26 according to the present embodiment transmits a third electrical signal (not shown in the figure) of the control signal to the fourth electrode 28 through the third light-emitting semiconductor 36 to continuously turning on the third light-emitting semiconductor 36. In other words, the third light-emitting element 361 of the third light-emitting semiconductor 36 emits light from the first time T1 to the fourth time T4. By using this light-emitting method, the differences among flat RGB pixels can be conspicuous effectively.

The first time T1 to the fourth time T4 form the persistence time of vision of human eyes. The persistence time of vision is the 0.01 to 0.1 second of lag and persistence of image while seeing objects or moving objects by human eyes. Preferably, the persistence time of vision is 0.1 second.

According to the present embodiment, by making the wavelengths of the light emitted from the first light-emitting element 321 (for example, the red light), the second light-emitting element 341 (for example, the green light), and the third light-emitting element 361 (for example, the blue light) different and by making use of the visual influence of persistence of vision on retinae, the light emitted from the micro LED as viewed by a user will be white.

The advantage of the present embodiment (the second embodiment) is that by adjusting the wavelengths of the light emitted from the first light-emitting element 321, the second light-emitting element 341, and the third light-emitting element 361, the wavelength of the light emitted from the light source can be controlled. For example, when the light emitted from the first light-emitting element 321, the second light-emitting element 341, and the third light-emitting element 361 belong to different color systems (for example, the three primary colors R, G, B), the combination of the three colors can form the white light for subsequent light-emitting usage.

As illustrated by the above embodiments, the present invention provides a micro LED formed by vertically stacking the first light-emitting semiconductor and the second light-emitting semiconductor. Thanks to the vertically stacked structure, the number of wires is halved and thus achieving the purpose of reducing the wires. Besides, the overall volume can be shrunk accordingly.

The invention claimed is:

1. A micro light-emitting diode, comprising:
   a substrate;
   a conductive layer, including a first electrode and a second electrode disposed on said substrate apart;
   a light-emitting assembly, disposed on said conductive layer, said light-emitting assembly including:
      a first light-emitting semiconductor, including a first light-emitting element, a first n-type electrode, and a first p-type electrode, a side of said first light-emitting element disposed on said conductive layer, said first n-type electrode and said first p-type electrode disposed on another side of said first light-emitting element, said first light-emitting element including a first light-emitting layer, and said first light-emitting layer including a first area; and a second light-emitting semiconductor, disposed vertically on said first light-emitting semiconductor, including a second light-emitting element, a second n-type electrode, and a second p-type electrode, said second n-type electrode disposed on said first p-type electrode, said second p-type electrode disposed on said first n-type electrode, said second light-emitting element disposed on said second p-type electrode and said second n-type electrode, said second light-emitting element including a second light-emitting layer, said second light-emitting layer including a second area, and said first area greater than said second area; and a conductive bump set, including a first conductive bump and a second conductive bump, an end of said first conductive bump disposed on the said electrodes and extending to a side of said first n-type electrode and a side of said second p-type electrode, an end of said second conductive bump disposed on said second electrodes and extending to a side of said first p-type electrode and a side of said second n-type electrode;

wherein during a persistence time of vision, any of said first electrode and said second electrode receives a control signal from said conductive layer for enabling an electrical conduction in one of said first light-emitting semiconductor and said second light-emitting semiconductor.

2. The micro light-emitting diode of claim 1, wherein said control signal includes a first electrical signal and a second electrical signal for enabling an electrical conduction in one of said first light-emitting semiconductor and said second light-emitting semiconductor sequentially.

3. The micro light-emitting diode of claim 1, wherein each wavelength of a light emitted from said first light-emitting element and said second light-emitting element is between 300 nanometers and 800 nanometers.

4. The micro light-emitting diode of claim 1, wherein a wavelength of a light emitted from said first light-emitting element is different from a wavelength of a light emitted from said second light-emitting element.

5. The micro light-emitting diode of claim 1, wherein an end of said first conductive bump is connected electrically to contacts of said first n-type semiconductor and said second p-type semiconductor; and another end of said first conductive bump is connected electrically to said first electrode.

6. The micro light-emitting diode of claim 1, wherein an end of said second conductive bump is connected electrically to contacts of said first p-type semiconductor and said second n-type semiconductor; and another end of said second conductive bump is connected electrically to said second electrode.

7. The micro light-emitting diode of claim 2, wherein said conductive layer further includes a third electrode and a fourth electrode; said third electrode is disposed on a side of said second electrode; and said fourth electrode is disposed on another side of said third electrode apart.

8. The micro light-emitting diode of claim 7, further comprising a third light-emitting semiconductor, including a third light-emitting element, a third n-type electrode, and a third p-type electrode, a side of said third light-emitting element disposed on an end of said third n-type electrode and an end of said third p-type electrode, another end of said third n-type electrode disposed on said fourth electrode, another end of said third p-type electrode disposed on said third electrode, said third electrode transmitting a third electrical signal of said control signal to said fourth electrode through said third light-emitting semiconductor for turning on said third light-emitting semiconductor continuously.

9. The micro light-emitting diode of claim 8, wherein a wavelength of a light emitted from said third light-emitting element is between 300 nanometers and 800 nanometers; and said wavelength of a light emitted from said third light-emitting element is different from a wavelength of said light emitted from said first light-emitting element and a wavelength of said light emitted from said second light-emitting element.

10. The micro light-emitting diode of claim 8, wherein said first light-emitting element, said second light-emitting element, and said third light-emitting element include an n-type semiconductor and a p-type semiconductor, respectively; said n-type semiconductors are disposed below said first light-emitting layer, said second light-emitting layer, and said third light-emitting layer, respectively; said p-type semiconductors are disposed on said first light-emitting layer, said second light-emitting layer, and said third light-emitting layer, respectively; and said n-type semiconductors are disposed on an insulating substrate.

* * * * *